United States Patent
Frank et al.

(10) Patent No.: US 7,106,078 B1
(45) Date of Patent: Sep. 12, 2006

(54) METHOD AND APPARATUS FOR MEASURING TRANSFORMER WINDING RESISTANCE

(75) Inventors: Jerry Frank, Villanova, PA (US); Eugene Gilman, Southampton, PA (US)

(73) Assignee: James G. Biddle Company, Norristown, PA (US)

( * ) Notice: Subject to any disclaimer, the term of this patent is extended or adjusted under 35 U.S.C. 154(b) by 0 days.

(21) Appl. No.: 11/195,839

(22) Filed: Aug. 3, 2005

(51) Int. Cl.
*G01R 29/22* (2006.01)

(52) U.S. Cl. ...................... 324/726; 324/547

(58) Field of Classification Search ............... 324/457, 324/726
See application file for complete search history.

(56) References Cited

U.S. PATENT DOCUMENTS

| | | | |
|---|---|---|---|
| 5,276,402 A | 1/1994 | Schucht | 324/726 |
| 5,546,010 A * | 8/1996 | Verhaart | 324/713 |
| 6,359,450 B1 * | 3/2002 | Zabler et al. | 324/713 |
| 6,396,279 B1 | 5/2002 | Gruenert | 324/424 |
| 6,418,389 B1 | 7/2002 | Peter et al. | 702/108 |
| 6,608,493 B1 | 8/2003 | Hensler et al. | 324/713 |
| 6,788,077 B1 * | 9/2004 | Hamdan | 324/726 |

FOREIGN PATENT DOCUMENTS

| | | |
|---|---|---|
| EP | 1 398 644 B1 | 9/2001 |
| JP | 60-219584 | 2/1985 |
| JP | 5-157795 | 6/1993 |
| RU | 2 161 314 | 1/2000 |
| RU | 2 192 020 | 2/2001 |

* cited by examiner

*Primary Examiner*—Walter Benson
(74) *Attorney, Agent, or Firm*—Antonelli, Terry, Stout and Kraus, LLP.

(57) ABSTRACT

The present invention is a method of and an apparatus for measuring resistances of at least one transformer winding (109) in configurations of connected transformers windings. The method is based on increasing driving power from the source of electrical energy (12, 102) until the current reaches a predetermined level, which is below the core saturation current level of the measured transformer or the measuring device current limit, and then controls the power of the source of the electrical energy to maintain predetermined current flowing through the at least one winding over a time period sufficient to cause a L di/dt contribution to a voltage drop across the at least one winding to decrease below a threshold level. The apparatus measures simultaneously the constant current flowing in the at least one winding and the voltage drop over the at least one winding after the predetermined time period has elapsed. The resistance of the at least one winding is calculated from the voltage drop over the at least one winding and the current flowing in the at least one winding.

34 Claims, 6 Drawing Sheets

METHOD AND APPARATUS FOR MEASURING TRANSFORMER WINDING RESISTANCE

BACKGROUND

1. Field of the Invention

The present invention pertains to the method and devices designed and constructed to test transformers. In particular, the present invention describes a method and apparatus for testing resistances of transformer windings and configurations of connected transformers windings. The invention has a broad applicability for testing of transformers of different sizes and power ratings.

2. Description of the Prior Art

Measurements of transformer winding resistances are common transformer diagnostic techniques. It is used to detect variety of transformer failures related to damage of winding conductors, terminals, or insulation.

Measurement of transformer winding resistance is inherently non-trivial because of the high inductance required for the basic function of the transformer. Some power transformers may exhibit inductances in excess of 2000H. Voltage drops over transformer windings are usually dominated by the inductive $L(i)di/dt$ contribution that can exceed the resistive $Ri$ contribution by several orders of magnitude.

The presence of the ferromagnetic transformer core, which is a standard in the transformer art, further complicates the problem of winding resistance measurements by introduction of nonlinear dependence of the inductance on the transformer current and the magnetic properties of the ferromagnetic core material. Characterization of magnetic properties of a ferromagnetic substance can be achieved using magnetic permeability $\mu$. The simplest description of ferromagnetic substances utilize the magnetic permeability $\mu$ as a dimensionless scalar multiplier (in the Gaussian cgs system of units)describing the enhancement of the magnetic flux density in the ferromagnetic material over the flux density in a vacuum produced by an equivalent source of the magnetic field. Ferromagnetic materials, like "Supermalloy", can exhibit maximal $\mu=1,000,000$, but reach saturation in high magnetic fields which asymptotically brings the magnetic permeability back to the vacuum value of 1.

The phenomenon of ferromagnetic saturation plays an important role in the prior art high current transformer resistance meters. In order to maximize resistive voltage drop $Ri$ over a transformer winding and simultaneously minimize the inductive $L(i)di/dt$ contribution to the voltage drop, the measuring devices of the prior art are designed to operate in the high current regime. For example, the High Current Resistance Meter Type 2292 of Tettex Instruments is designed to deliver maximum DC test current of 50A.

The high current testers of the prior art are large and heavy devices utilizing massive, heavily insulated conductors and connectors. Operation in the vicinity of the saturation of the transformer core exposes the operators and the equipment to the hazards of accidental discharge of the significant magnetization energy stored in the transformer core. In addition, the measurement process takes a relatively long time to bring the core near saturation to cause the $L(i)di/dt$ voltage to be small enough to provide valid measurements by reducing $L$ and $di/dt$ to negligible levels. A similarly long time must be spent to safely discharge and dissipate the stored energy.

Alternative methods of transformer parameter testing are known:

US Patent Application 2004/0130329 corresponding to the European Patent EP1398644, by Suss, describes a method of transformer testing according to the IEC 60044-6 Standard. The described method for testing instrument transformers utilizes transformer test signals of more than one frequency (that can be lower that the operating frequency of the transformer) to obtain a set of transformer frequency-dependent responses, which are used to derive a simulation model of the transformer. The resulting simulation model is used for calculation of the transformer parameters required by the IEC 60044-6 Standard.

The U.S. Pat. No. 6,608,493 by Thomas et al. describes an automatic portable transformer tester. The essence of this invention is the use of a matching transformer between a computerized signal source and the tested device. The matching transformer expends the testing parameter space covered by a compact "portable" signal source.

Russian Patent RU2192020 by Nefed, protects usage of external "frequency independent coaxial shunt" and a current comparator in current transformers testing. This is an illustration of the testing methods based on addition of known external components to the measured transformer in order to execute the measurements or facilitate the measured data analysis.

U.S. Pat. No. 5,276,402 by Schuch, describes relatively conventional method of "ANSI-required" three phase transformer testing, based on simultaneous monitoring of six parameters associated with three phases. The emphasis is on convenience, ease of usage, and operator error avoidance.

Japanese Patent JP5157795 by Komatsu protects measuring method which involves switchable "signal source 2" that can switch power of the test signal between primary or secondary windings of the tested transformer. The method eliminates the need for discharging and disconnecting the measured transformer when the measurements on primary and secondary sides of the transformer are needed.

Japanese Patent JP60219564 by Azuma et al. is an illustration of the transformer testing methods based on applications of external bridge circuits. Bridges are relatively common in transformer diagnostics prior art in spite of the inherent complexity of the method and complicated analysis and processing of the measurement results.

The above identified methods of transformer diagnostics are only examples of well-developed prior art of specialized testing of specific subgroups of transformers. This prior art differs from the present invention by relative complexity and focused applicability of the protected methods and apparatus.

SUMMARY OF THE INVENTION

The present invention is a method of and an apparatus for measuring resistances of at least one transformer winding. The method utilizes test current signals with the maximum test current lower than either the core saturation current of the measured transformer or the measuring device current limit.

The apparatus and method of the present invention achieves the minimization of inductive voltage drop $L(i)di/dt$ by actively controlling $di/dt$ such that the $L(i)di/dt$ term is held very close to zero. This allows for the $Ri$ voltage drop to dominate even when the controlled test current levels are substantially below the saturation values. Operating below the saturation current of a transformer allows for a compact, portable, device which can measure transformer winding resistances even for the largest power transformers in a few seconds, regardless of the magnetic and electric coupling between transformer windings. An additional benefit of making the measurements at substantially below saturation is that the amount of stored energy is significantly reduced, which in turn, minimizes the risk to the operators and the equipment.

The method is based on connecting the at least one winding to the source of electrical energy; increasing driving power from the source of electrical energy applied to the at least one winding until current in the at least one winding provided from the source of electrical energy reaches a predetermined level which is below a core saturation current level of the transformer whose at least one winding is having its resistance measured or a current limit of the source of electrical energy; controlling the power from the source of electrical energy applied to the at least one winding to maintain the predetermined current flowing through the at least one winding over a desired time period sufficient to cause a L di/dt contribution to the voltage drop across the at least one winding to decrease below a threshold level; and calculating the resistance of the at least one winding from the measured current flowing through the at least one winding and the voltage drop across the at least one winding.

A method for measuring resistance of at least one winding of a transformer utilizing a test current with a maximum test current less than either a core saturation current of a transformer whose at least one winding is having its resistance measured or a current limit of a source of electrical energy used for measuring of the resistance in accordance with the invention includes selecting at least one transformer winding for measurement of winding resistance of the at least one winding; connecting the at least one winding to the source of electrical energy; increasing driving power from the source of electrical energy applied to the at least one winding until current in the at least one winding provided from the source of electrical energy reaches a predetermined level which is below a core saturation current level of the transformer whose at least one winding is having its resistance measured or a current limit of the power source of electrical energy; controlling the power from the source of electrical energy applied to the at least one winding to maintain the predetermined current flowing through the at least one winding over a time period sufficient to cause a L di/dt contribution to a voltage drop across the at least one winding to decrease below a threshold level; and calculating the resistance of the at least one winding from a measured current flowing through the at least one winding and a voltage drop across the at least one winding which are measured after the time period. The at least one winding may be a primary winding, a secondary winding, or a winding that is a winding other than a primary or a secondary winding of the transformer. The at least one winding may be contained in a set of transformer windings connected in series to form a series winding resistance measuring configuration, connected in parallel to form a parallel winding resistance measuring configuration, or in series-parallel to form a series-parallel winding resistance measuring configuration. The increasing driving power from the source of electrical energy may be achieved by controlled increase of the output voltage of the source of electrical energy or controlled increase of the output current of the source of electrical energy. The power of the source of the electrical energy may be controlled to maintain the predetermined current flowing in the at least one winding over the time period which is achieved automatically using a feedback loop. The feedback loop may use the measured current flowing in the at least one winding or the voltage drop over the at least one winding as an the input control parameter of a control of the power source of electrical energy. The power of the source of the electrical energy may be controlled to achieve the predetermined current flowing in the at least one winding over the time period by a program supplied for testing the resistance of the at least one winding. A maximum variation in the predetermined current flowing in the at least one winding over the time period may be less than a ratio of the predetermined current flowing in the at least one winding and $T_L$ wherein $T_L$ is a time period defined by the inductance of the at least one winding L divided by R where R is a measured resistance of the at least one winding. A maximum variation in the predetermined current flowing in the at least one winding the time period may be less than $\frac{1}{5}$, $\frac{1}{10}$ or $\frac{1}{100}$ of a ratio of the predetermined current flowing in the at least one winding and $T_L$ which is a time period defined $T_L$ being the inductance of the at least one winding L divided by R where R is a measured resistance of the at least one winding.

A device for measuring resistance of at least one winding of a transformer utilizing test current signals with a maximum current lower than a core saturation current of the transformer whose at least one winding is having its resistance measured in accordance with the invention includes a power supply which, when attached to an external source of electrical energy, provides electrical power; a controllable power electronics, coupled to the power supply, that provides a predetermined test current with a maximum current lower than the core saturation current for connection to the at least one winding; a current monitor coupled to the controllable power electronics and for connection to the at least one winding that measures the current flowing in the at least one winding; and a voltage monitor for connection to the at least one winding that measures a voltage drop over the at least one winding; a control system, coupled to the power supply and to the power electronics that controls the controllable power electronics to generate the predetermined test current according to a predetermined test current value wherein the predetermined test current flows through the at least one winding over a time period sufficient to cause a L di/dt contribution to a voltage drop across the at least one winding to decrease below a threshold level. The external source of electrical energy may be the electrical power grid, an electrical energy storage system not connected to an electrical power grid, a generator driven system not connected to an electrical power grid, fuel cell driven system not connected to an electrical power grid, or photovoltaic source driven system. The control system may configure an analog feedback loop controlled by current flowing in the at least one winding which is measured by the current monitor or a voltage drop over the at least one winding, measured by a voltage monitor. The control system may contain an analog feedback loop controlled by the rate of change of the voltage drop over the at least one winding, measured by the voltage monitor. The control system may also calculate, store, and communicate a measured resistance of at least one winding under test. The control system may also provide interfacing with the device users. The control system may contain at least one programmable system that stores predetermined test parameters, measured current flowing in a resistance measuring configuration of the at least one winding and a voltage drop across the resistance measuring configuration, control the controllable power electronics, calculate and store to the resistance value of the at least one winding under test, and provide an interface with the device users of the devices. The programmable system may be a microprocessor, an Application Specific Integrated Circuit (ASIC), a Digital Signal Processor (DSP), a Programmable Logic Device (PLD) or a microcontroller.

BRIEF DESCRIPTION OF THE DRAWINGS

FIG. 5 shows a winding resistance measuring configuration comprising an individual transformer winding in FIG. 5a, a series winding resistance measuring configuration in FIG. 5b, a parallel winding resistance measuring configuration in FIG. 5c, and a parallel-series winding resistance measuring configuration in FIG. 5d.

Like reference numerals identify like parts throughout the drawings.

DETAILED DESCRIPTION OF THE INVENTION

Figure 4:
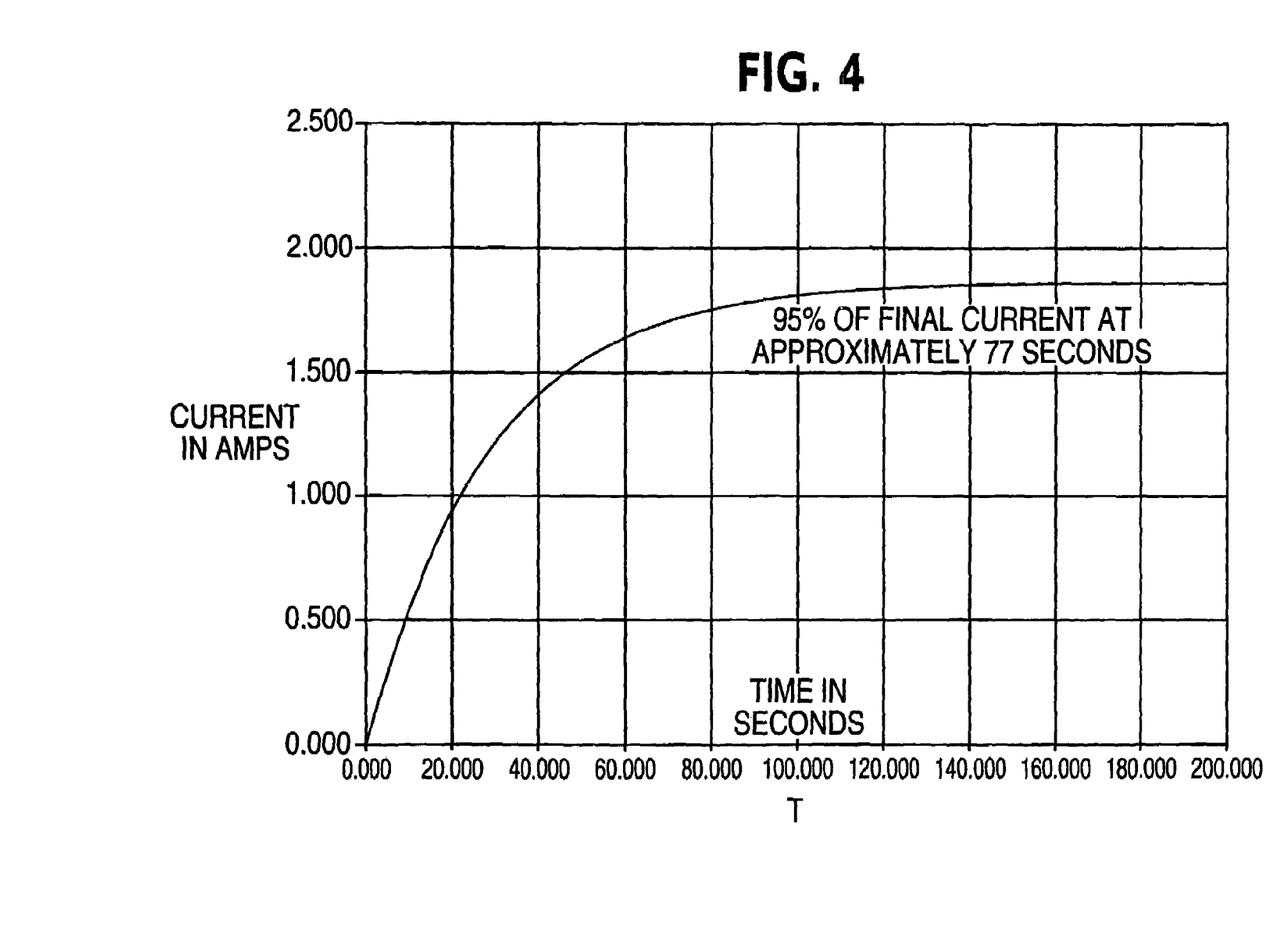
FIG. 4 is a graph representing time dependence of test current flowing through primary winding of a transformer in accordance to the prior art.
Figure 5A:
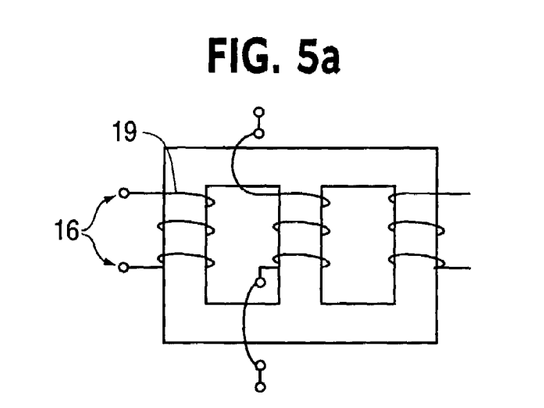
Figure 5B:
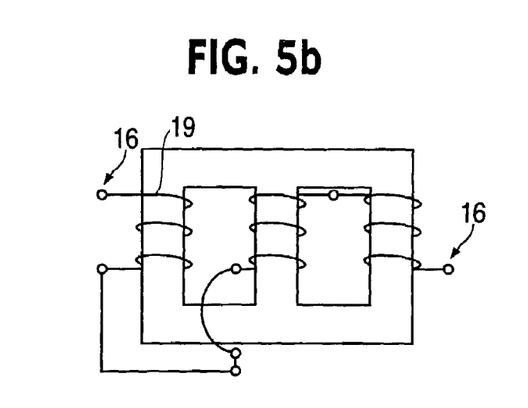
Figure 5C:
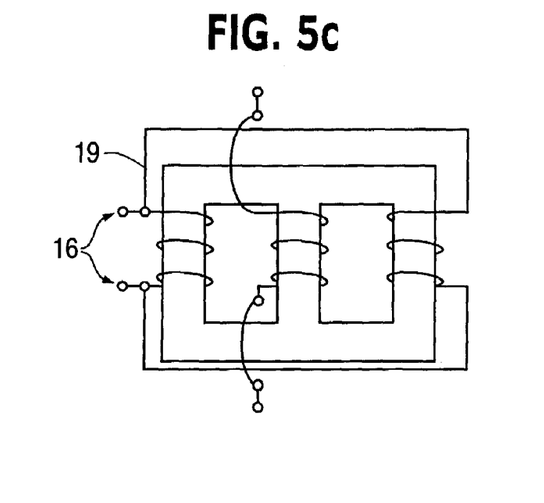
Figure 5D:
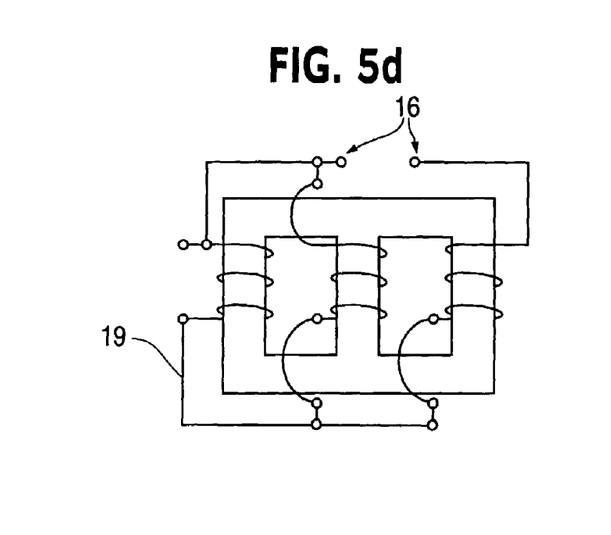

A time-dependent voltage drop V(t) over a general configuration of at least one connected transformer winding conducting current i(t) is given by the following equation:

$$V(t) = L(i) di/dt + Ri(t) \qquad (1)$$

where R is the effective resistance of the configuration, and the L(i) is the inductance of the configuration. If the configuration of windings is connected to the external, stable power supply at t=0 and left undisturbed for a sufficient time, the current i(t) will stabilize approaching its constant asymptotic value i(∞). Then, as the di/dt→0, the resistance R can be easily determined as the ratio V(∞)/i(∞). This is the basis for many methods for transformer winding resistance measurements of the prior arts such as illustrated in FIG. 4. As may be seen in FIG. 4, the larger current approaching 2000 amps takes many seconds to reach an asymptotic value in view of the large time constant resultant from the inductance of the inductance of the winding under test.

The method of transformer winding resistance measurements in accordance to the present invention is based on the active control of the voltage V(t) in the Equation (1) to maintain a predetermined current flowing through the at least one winding over a desired period of time sufficient to cause a L di/dt contribution to the voltage drop across the at least one winding to decrease below a threshold level. The power source in accordance to the present invention is shown in a block diagram in FIG. 1.

Figure 1:
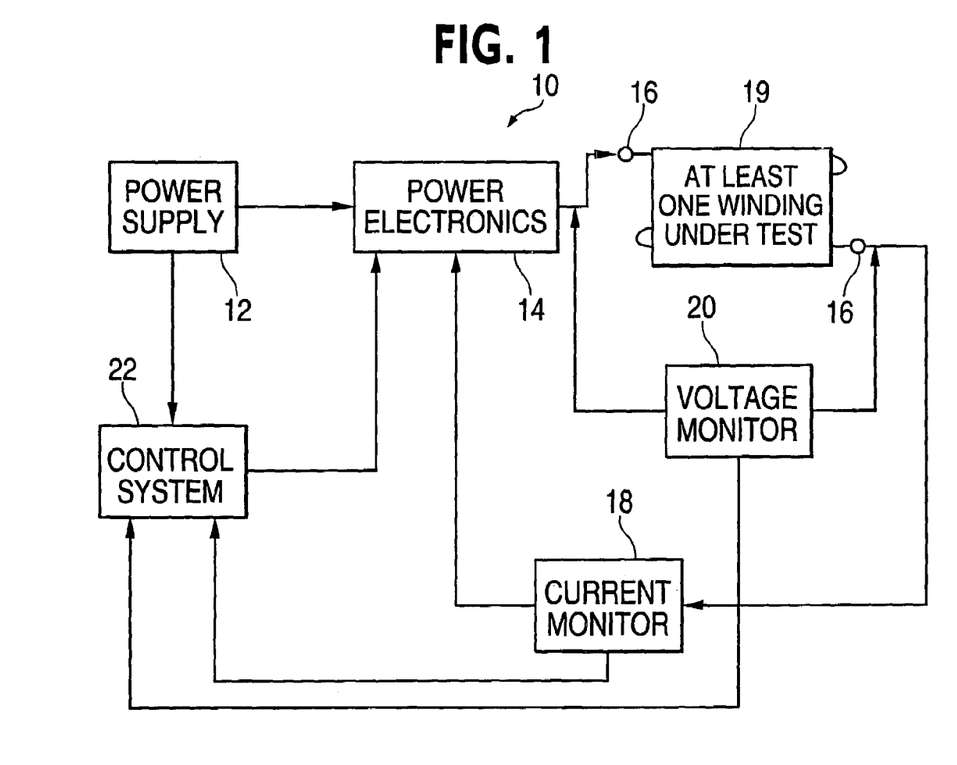
FIG. 1 is a block diagram of a first embodiment of the invention for measuring transformer winding resistance.

A first embodiment of a transformer winding resistance measuring device 10 shown in FIG. 1 is powered by a power supply 12 which, when attached to an external source of electrical energy (not illustrated), provides electrical power to the components of the device. A controllable power electronics module 14 provides a desired test current signal with the maximum current substantially lower than the core saturation current to the connecting terminals 16 of the winding resistance measuring configuration 19 comprising at least one winding as for example illustrated in FIGS. 5a–d. A current monitor 18 measures the current flowing in the winding resistance measuring configuration as for example without limitation illustrated in FIGS. 5a–d during the testing, and a voltage monitor 20 that measures the voltage drop over the winding resistance measuring configuration 14. A control system 22 controls the controllable power module to generate the test current signal according to predetermined values, user input and measured currents and voltage drop values, calculates, stores, and communicates measured resistances, and provides interfacing with the device users.

The power electronic module 14 can be designed as a controllable voltage source providing an increase of the driving voltage during the ramping of the current flowing through the at least one winding such as but not limited to the configuration of FIGS. 5a–d. When the current approaches the desired predetermined test current value, the driving voltage is modified by a feedback loop or otherwise in order to stabilize the current flowing through the at least one winding, and achieve the di/dt≈0 condition. Equivalently, the power electronic module 14 can be designed as a controllable current source that directly controls the current inserted in the at least one winding through the connecting terminals 16, both during the current ramp-up to the desired test current value and during a measurement phase when the substantially constant measurement current with di/dt≈0 is maintained at which time the resistance of the at least one winding is calculated from the voltage and current measured by the current and voltage monitors 18 and 20. The voltage source and the current source designs are functionally equivalent. The inspection of the equation (1) directly implies that the increase of the voltage V(t) must result in the positive di/dt and the increase in the current i(t). Once the condition di/dt≈0 is achieved, the voltage and current are linearly related and the control of either one of the two values causally results in the control of the other.

Figure 3:
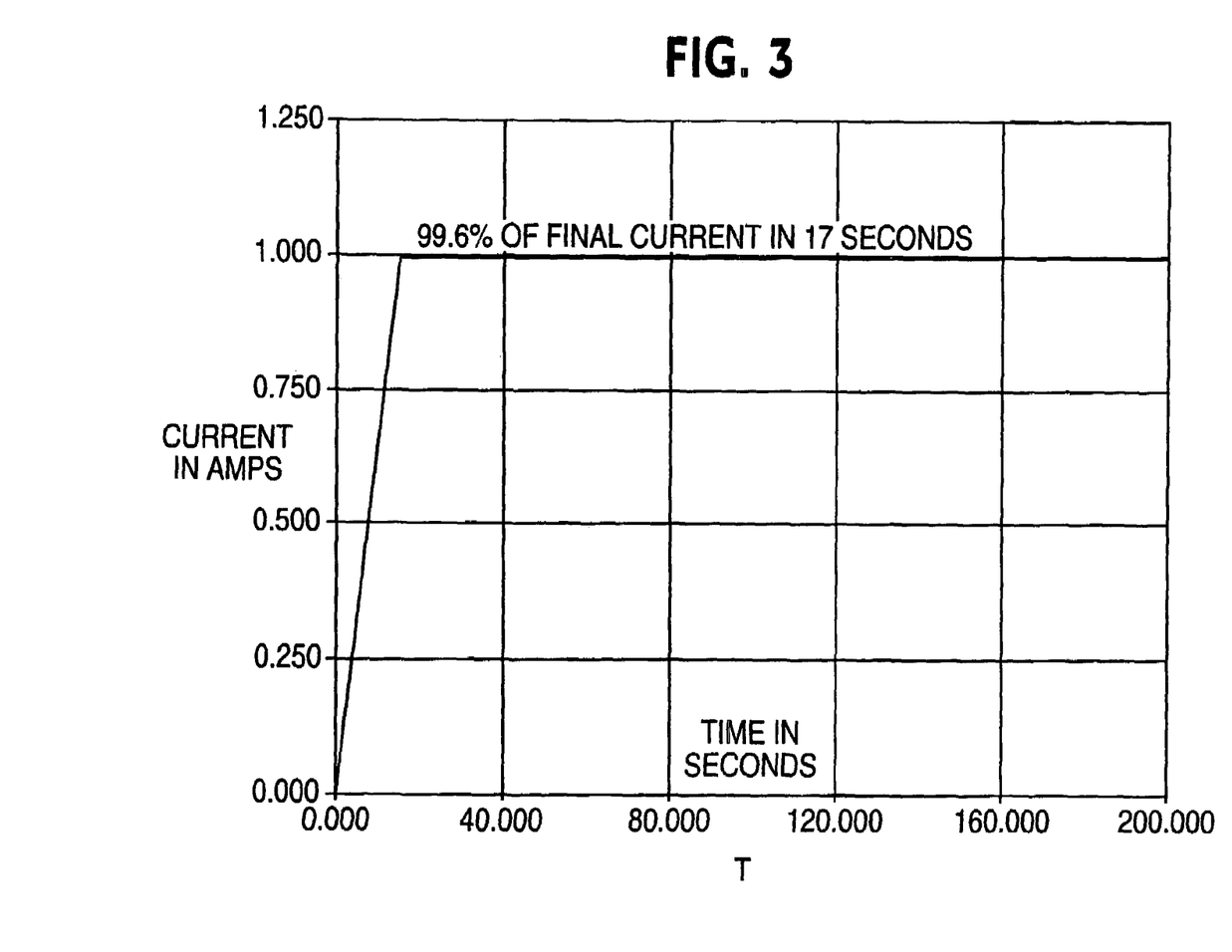
FIG. 3 is a graph representing time dependence of the controlled test current flowing through a primary winding of a transformer in accordance to the present invention.

The control system 22 continuously receives and stores the time-dependent values of the current flowing in the resistance measuring configuration measured by the current monitor 18 and the time-dependent values of the voltage drop as measured by the voltage monitor 20. The control system 22 generates control signal used to control the output of the controllable power electronics module 14. In a preferred embodiment, the control system 22 acts as a feedback loop that compares measured current flowing in the resistance measuring configuration as measured by the current monitor 18, and user-provided or factory set desired constant current level for the particular resistance measurement. The control signal causes the power electronics module 14 voltage to increase if the measured current is below the desired current level and conversely causes the power electronics module voltage to decrease if the measured current is above the desired current level. Thereby to have sufficient regulation of the current being substantially over time as illustrated in FIG. 3 to case L di/dt→0. The steps of voltage increase and decrease are proportional to the absolute difference between the measured and predetermined desired current values.

The described current-controlled feedback loop is only one of the control procedures applicable to the present invention. The interchangeability of current and voltage values is explained above. Consequently, the measured current and measured voltage signals can be used equivalently by the control system 22 to control either output current or output voltage from the power electronic module 14 in accordance to the present invention. One consequence of this is that usage of any functional combination of current and voltage control signals to control any single value function of the power electronic module 14 output voltages and currents is part of the methods of the invention.

The feedback loop control system is flexible and widely applicable. If the transformer resistance measurements are performed repetitively for measurement of the resistance of many similar transformers (for example if the winding resistance measuring apparatus is used for testing transformers on an assembly line) the feedback loop may not be necessary. The output of the power electronics module 14 would be controlled more efficiently by a user supplied program. The program may contain functional dependence of output current or voltage on time, or a simple look-up table. The program data may result from an analytical calculation, computer model, or may be predetermined by experimentation.

Figure 2:
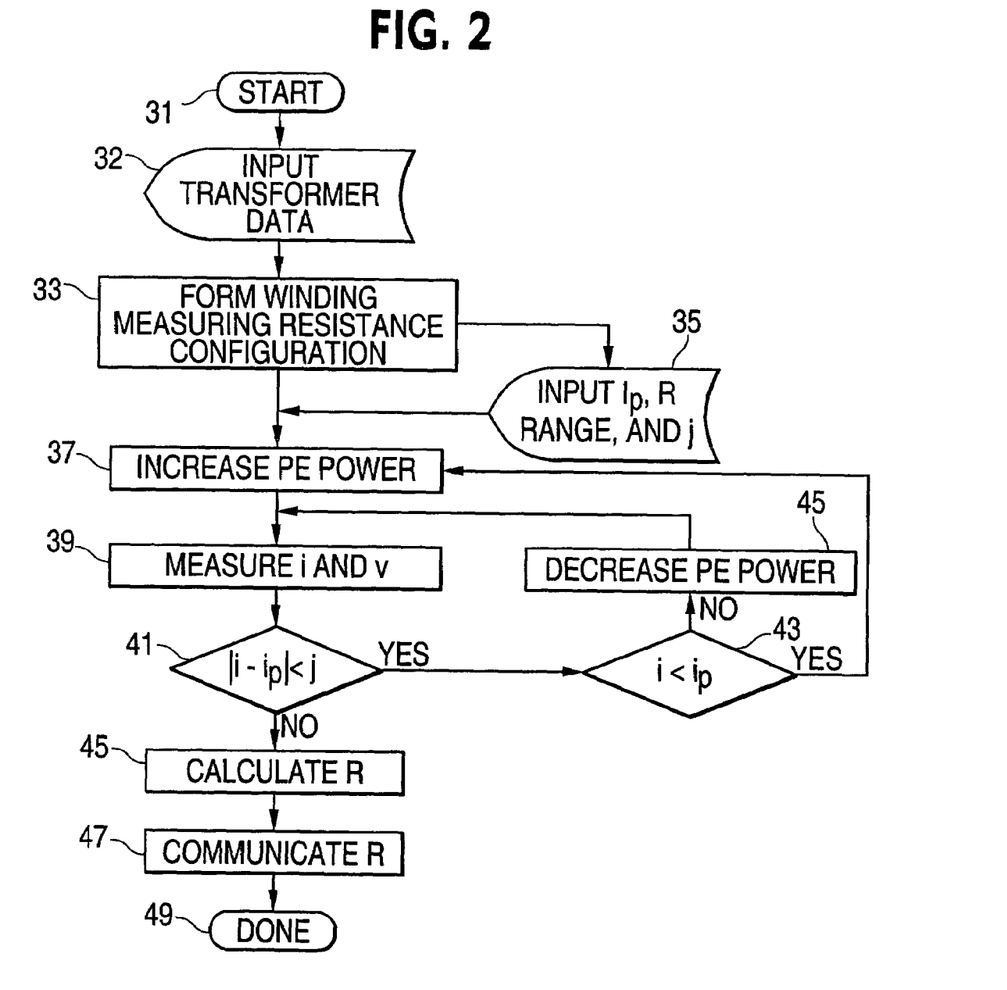
FIG. 2 is a flowchart diagram of the method of the present invention for measuring transformer winding resistance.

The method of operation of the transformer winding resistance measuring device 10 shown in FIG. 1 is presented in the flowchart form in FIG. 2. The flowchart illustrates a feedback loop controlled algorithm. The "start" step 31 represents the functions necessary for initial powering of the at least one transformer winding under test. The "Input Transformer Data" of step 32 represents operations of identification of the transformer, transformer power ratings, transformer condition, connecting terminals, relationships between windings and the external circuit, and other task-specific information. The "Form Winding Measurement Resistance Configuration" step 33 represents activity of identifying terminals of at least one winding and connecting the winding or the configuration of windings to the measuring apparatus 10. Based on the transformer data and the winding resistance measuring configuration, the operator inputs the predetermined current limit $i_p$, resistance range setting, and the desired accuracy quantified by the convergence parameter j as depicted in the step 35. The determination of the above measurement parameters is by necessity task-specific and can not be fully automatic. The user can be assisted by the preprogrammed menus encoded in the operating system, or by examples and tabulated recommendations from the device's user manual. The completion of the data input stage triggers the power electronics module 14 to increase power represented by the "Increase PE (power electronics)Power" step 37. The current i flowing throw the winding measuring configuration 19 and the voltage drop v over the winding measuring configuration is sampled during the measurement as represented by step 39. The sampled current i is compared with the predetermined current $i_p$ using the predetermined convergence criterion j as stated in the step 35. If the absolute current difference |i-ip| is larger than the convergence parameter j, the comparison 43 is performed. The i<ip condition causes the "decrease of the of power" step 43. The opposite condition causes the further "Increase of PE Power" step 37. The current and voltage sampling of the Measure I and v" of step 39 is repeated and convergence tested until the criterion 41 is stably satisfied. After the stabile convergence is achieved, the resistance can be calculated at step 45 and communicated at step 47 to the user or the user's data acquisition system. The step 49 represents activities associated with the depowering and disconnecting the measuring apparatus.

An example of the operation of the transformer winding resistance measuring apparatus of FIGS. 1 and 6 as described below in accordance to the current invention to control the application of a predetermined current value to the at least one winding under test to have a stable test current which causes L di/dt→0 in as small a time as possible is represented in FIG. 3. The apparatus is attached to the transformer primary winding having impedance of approximately 750H when conducting current in the range of 0.5A to 2A. The internal resistance of the measuring apparatus is 25 Ω. At t=0s, the initial voltage of 50V is switched on. The rise of the current through the primary of the transformer is graphed. When the current approaches the pre-selected limit of 1A, the voltage is gradually reduced to the final value of 26.8V necessary to sustain the constant current i(∞)=1A. Total circuit resistance of 26.80 (26.8V driving 1A, 26.8W) indicates 1.8 Ω winding resistance (in addition to 25 Ω internal resistance of the instrument). The 99.6% of the i(∞) is reached in approximately 17s, while the current stability sufficient for 1% accuracy in primary winding resistance measurement is achieved in approximately 20s. The current characteristic over time is achieved by regulation of current and/or voltage applied by the power electronics 14 as described above and further below.

The results of the model of the corresponding measurement in accordance to the prior art is presented in the FIG. 4. The 50V voltage is switched on at t=0s and the system is left to evolve with no further regulation. The inspection of the current evolution in FIG. 4 results in time period approximately 160s necessary for the current to reach 99% of asymptotic current i(∞)→1.86A. In addition, the measurement requires minimum of 93.3W of sustained power dissipated in the transformer and the measuring apparatus.

The fundamental accuracy limit of the described methods is the relative importance of the residual value of the L di(∞)/dt term in the equation (1) in comparison to the R i(∞) term. High accuracy requires that R i(∞) dominates (R i(∞)>>) L di(∞)/dt). Consequently, the control of the constant current i(∞) must be such that di(∞)/dt<<R i(∞)/L. The L/R time constant is the inductive time constant of the circuitry $T_L$ which characterizes the time necessary for significant changes in transformer currents. The apparatus of current invention can routinely control the current to 1 mA over 100s. This controllability allows for diagnostics of large power transformers with $T_L$ in excess of 10,000s.

The active current control feature of the apparatus of the invention allows a test current significantly lower than used in the prior art and allows for lower power consumption than the operation of the devices of prior art. Because of these benefits, the apparatus of the invention can be powered directly from the residential power grid. If the grid power is not available, the apparatus of current invention can be powered by the electrical energy stored in a storage system (chemical cells and "batteries" or a capacitor bank), converted by the use of internal combustion generators, fuel cells, photovoltaic cells, or any other source of electrical energy independent from the power grid.

The active current control feature of the apparatus of the invention that keeps di(∞)/dt≈0 also means that the magnetic relationship between different transformer windings does not influence resistance measurements. Any individual transformer winding (primary, secondary, tertiary, diagnostic etc.) can comprise a winding resistance measuring configuration, as shown without limitation in the FIG. 5a, and can be measured independently. Also any set of windings can be connected in series (FIG. 5b), parallel (FIG. 5c), or a parallel-series winding resistance measuring configuration (FIG. 5d) and the equivalent resistance may be measured without regard of any other winding not connected in the winding resistance measuring configuration. The equivalent resistance measurement of a series winding resistance measuring configuration of (FIG. 5b)is frequently used in the transformer diagnostic art for detection of the potential damages of winding conductors. The parallel winding resistance measuring configuration (FIG. 5c) can be used for detection of the insulation failure between windings, while the parallel-series winding resistance measuring configuration (FIG. 5d) can be beneficial for diagnostics of multiphase transformers.

Any windings that are not part of the winding resistance measuring configuration can be left connected to their usual terminals as long as the proper insulation is provided for the moderate voltages and currents induced during the ramp-up of the test current. This convenient feature of the invention can be extended even to windings of several distinct transformers. The windings of several transformers can be included in the winding resistance measuring configuration and resistance measured as specified in this application.

DESCRIPTION OF THE PREFERRED EMBODIMENT

Figure 6:
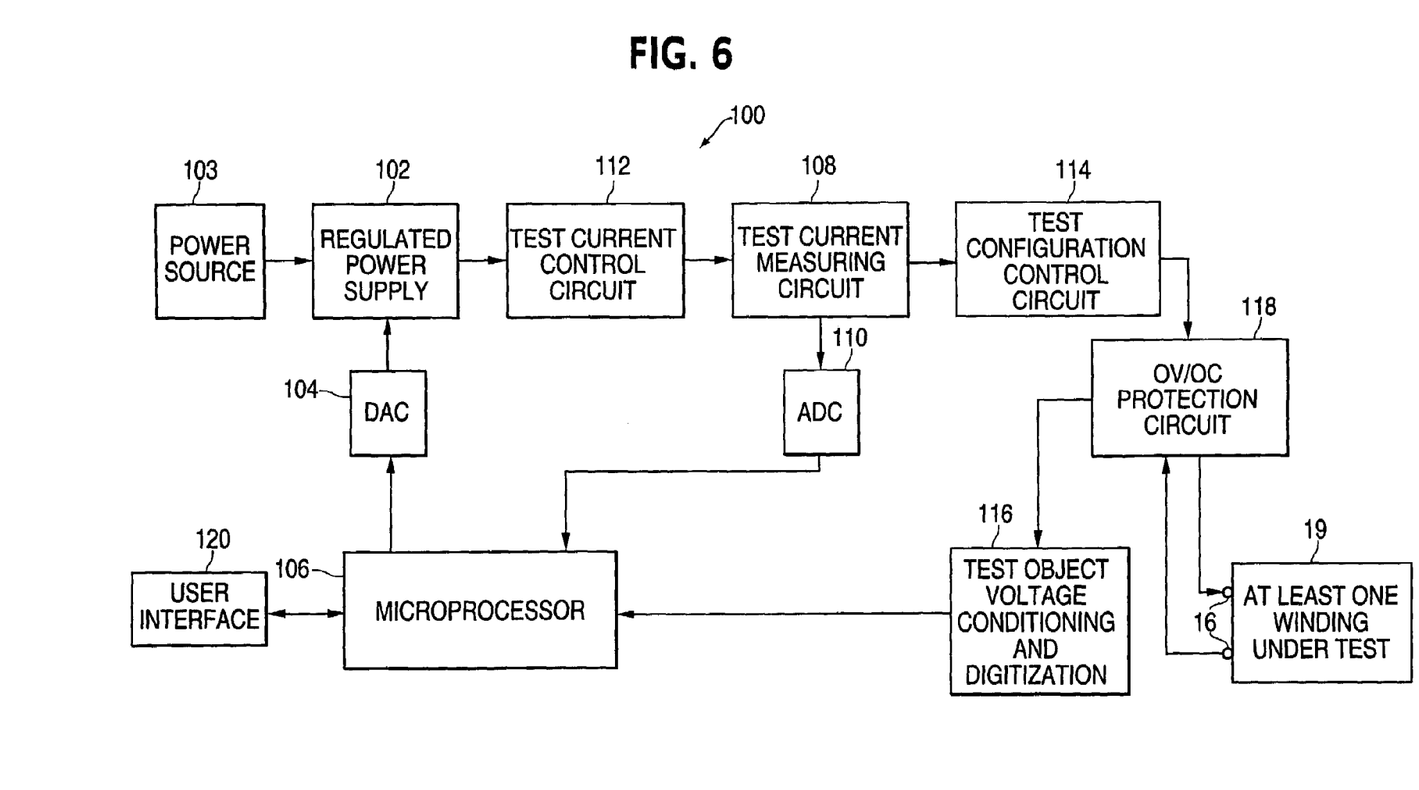
FIG. 6 depicts a block diagram of a second preferred embodiment of the invention for measuring transformer winding resistance.

The preferred embodiment 100 is illustrated in FIG. 6. A regulated power supply 102 is coupled to a source of power source 103. The regulated power supply 102 provides a regulated DC output for transformer winding resistance testing. The power supply output voltage and current is regulated by the digital-to-analog converter (DAC) 104. The output of the DAC 104 is set by microprocessor 106. The test current control circuit 112 contains variable frequency and buck converters which, controlled by the microprocessor 106, deliver the appropriate amount of test current to the test current configuration circuit 114. The test current measuring circuit 108 measures the regulated power supply output current. The measured current is converted by analog-to-digital converter (ADC) 110 to its digital replica and transferred to a microprocessor 106. The test configuration circuit 114 utilizes a system of relays to conduct the test current through the appropriate connecting terminals 16 to the at least one transformer winding 19 of the winding resistance measuring configuration under test. The overvoltage and over current protection circuit 118 protects the instrument against the resulting voltage transient should the leads become disconnected while the test is being conducted. This circuit also serves to discharge the transformer once the text has been complete. The voltage drop over the at least one winding 19 is conditioned by filtering, amplified to fit the dynamic range of the ADC 110, and converted to its digital replica in conditioning/ADC circuit 116. Then the signal is transferred to the microprocessor 106. The microprocessor 106 also receives the user input and provide the output data to the user or user-controlled computers, printers, peripherals, storage media or networks via user interface 120.

When the test is initiated, the D.C., regulated power supply 102 is set to its maximum output. Initially, the winding inductance is high (>10 H), and the test current is almost zero. As the output current approaches the predetermined test current, the current control loop, which includes test current measuring circuit 108, ADC 110, microprocessor 106, DAC 104, regulated power supply 102, and test current control circuit 112, automatically decreases the output voltage to the point where it is just sufficient to maintain the predetermined test current. Once the current has stabilized to the predetermined $i(\infty)$ value, data can be used for the calculation of the winding resistance by the microprocessor 106.

It should be noted that this preferred embodiment is designed on a particular set of product specifications and design preferences and it is not the only possible design. The invention may also include control systems based upon pre-testing or results of modeling. The control system can be digital or analog, using set points, fuzzy logic, successive approximation, proportional, proportional-integral or proportional-integral-derivative control algorithms.

The preferred embodiment utilizes microprocessor 106 for the control of the apparatus. Many alternative methods and apparatus utilizing the following: application specific integrated circuit (ASIC), digital signal processors (DSP), programmable logic devices (PLD) and other electronic components for the control of the constant test current $i(\infty)$ in accordance to the described method can be also used.

While the invention has been described in terms of its embodiment it should be understood that numerous modifications may be made without deporting from the spirit and scope of the invention. It is intended that all such modifications fall within the scope of the appended claims.

We claim:

1. A method for measuring resistance of at least one winding of a transformer utilizing a test current with a maximum test current less than either a core saturation current of a transformer whose at least one winding is having its resistance measured or a current limit of a source of electrical energy used for measuring of the resistance comprising:

selecting at least one transformer winding for measurement of winding resistance of the at least one winding;
   connecting the at least one winding to the source of electrical energy;
   increasing driving power from the source of electrical energy applied to the at least one winding until current in the at least one winding provided from the source of electrical energy reaches a predetermined level which is below a core saturation current level of the transformer whose at least one winding is having its resistance measured or a current limit of the power source of electrical energy;
   controlling the power from the source of electrical energy applied to the at least one winding to maintain the predetermined current flowing through the at least one winding over a time period sufficient to cause a L di/dt contribution to a voltage drop across the at least one winding to decrease below a threshold level;
   and calculating the resistance of the at least one winding from a measured current flowing through the at least one winding and a voltage drop across the at least one winding which are measured after the time period.

2. The method of claim 1 wherein the at least one winding is contained in a set of transformer windings connected in series to form a series winding resistance measuring configuration.

3. The method of claim 1 wherein the terminals of the at least one winding is contained in a set of transformer windings connected in parallel to form a parallel winding resistance measuring configuration.

4. The method of claim 1 wherein the at least one winding is contained in the set of transformer windings connected in series-parallel to form a series-parallel winding resistance measuring configuration.

5. The method of claim 1 wherein the increasing driving power from the source of electrical energy is achieved by controlled increase of the output voltage of the source of electrical energy.

6. The method of claim 1 wherein the increasing driving power from the source of electrical energy is achieved by controlled increase of the output current of the source of electrical energy.

7. The method of claim 1 wherein the power of the source of the electrical energy is controlled to maintain the predetermined current flowing in the at least one winding over the time period is achieved automatically using a feedback loop.

8. The method of claim 7 wherein the feedback loop uses the measured current flowing in the at least one winding as an the input control parameter of a control of the power source of electrical energy.

9. The method of claim 8 wherein the at least one winding is a primary winding of the transformer.

10. The method of claim 8 wherein the at least one winding is a secondary winding of the transformer.

11. The method of claim 8 wherein the at least one winding is a winding that is a winding other than a primary or a secondary winding of the transformer.

12. The method of claim 7 wherein the feedback loop uses a measured voltage drop over the at least one winding as the input control parameter of a control of the power source of electrical energy.

13. The method of claim 1 wherein the power of the source of the electrical energy is controlled to achieve the predetermined current flowing in the at least one winding over the time period by a program supplied for testing the resistance of the at least one winding.

14. The method of claim 1 wherein a maximum variation in the predetermined current flowing in the at least one winding over the time period is less than a ratio of the predetermined current flowing in the at least one winding and $T_L$ wherein $T_L$ is a time period defined by the inductance of the at least one winding L divided by R where R is a measured resistance of the at least one winding.

15. The method of claim 1 wherein a maximum variation in the predetermined current flowing in the at least one winding the time period is less than ⅕of a ratio of the predetermined current flowing in the at least one winding and $T_L$ is a time period defined by wherein $T_L$ is the inductance of the at least one winding L divided by R where R is a measured resistance of the at least one winding.

16. The method of claim 1 wherein a maximum variation in the predetermined current flowing in the at least one winding over the time period is less than 1/10 of a ratio of the predetermined current flowing in the at least one winding and $T_L$ is a time period defined by wherein $T_L$ is the inductance of the at least one winding L divided by R where R is the measured resistance of the at least one winding.

17. The method of claim 1 wherein a maximum variation in the predetermined current flowing in the at least one winding over the time period is less than 1/100 of the ratio of a predetermined current flowing in the at least one winding and $T_L$ is a time period defined by wherein $T_L$ is the inductance of the at least one winding L divided by R where R is the measured resistance of the at least one winding.

18. A device for measuring resistance of at least one winding of a transformer utilizing test current signals with a maximum current lower than a core saturation current of the transformer whose at least one winding is having its resistance measured comprising:
   a power supply which, when attached to an external source of electrical energy, provides electrical power;
   a controllable power electronics, coupled to the power supply, that provides a predetermined test current with a maximum current lower than the core saturation current for connection to the at least one winding;
   a current monitor coupled to the controllable power electronics and for connection to the at least one winding that measures the current flowing in the at least one winding; and
   a voltage monitor for connection to the at least one winding that measures a voltage drop over the at least one winding;
   a control system, coupled to the power supply and to the power electronics that controls the controllable power electronics to generate the predetermined test current according to a predetermined test current value wherein the predetermined test current flows through the at least one winding over a time period sufficient to cause a L di/dt contribution to a voltage drop across the at least one winding to decrease below a threshold level.

19. The device of claim 18 wherein the external source of electrical energy is the electrical power grid.

20. The device of claim 18 wherein the external source of electrical energy is an electrical energy storage system not connected to an electrical power grid.

21. The device of claim 18 wherein the external source of electrical energy is a generator driven system not connected to an electrical power grid.

22. The device of claim 18 wherein the external source of electrical energy is a fuel cell driven system not connected to an electrical power grid.

23. The device of claim 18 wherein the external source of electrical energy is a photovoltaic source driven system.

24. The device of claim 18 wherein the control system configures an analog feedback loop controlled by current flowing in the at least one winding which is measured by the current monitor.

25. The device of claim 18 wherein the control system contains an analog feedback loop controlled by a voltage drop over the at least one winding, measured by a voltage monitor.

26. The device of claim 18 wherein the control system contains an analog feedback loop controlled by the rate of change of the voltage drop over the at least one winding, measured by the voltage monitor.

27. The device of claim 18 wherein the control system also calculates, stores, and communicates a measured resistance of at least one winding under test.

28. The device of claim 18 wherein the control system also provides interfacing with the device users.

29. The device of claim 18 wherein the control system contains at least one programmable system that stores predetermined test parameters, measured current flowing in a resistance measuring configuration of the at least one winding and a voltage drop across the resistance measuring configuration, controls the controllable power electronics, calculates and stores to the resistance value of the at least one winding under test, and provides an interface with the device users of the devices.

30. The device of claim 29 wherein the programmable system is a microprocessor.

31. The device of claim 29 wherein the programmable system is an Application Specific Integrated Circuit (ASIC).

32. The device of claim 29 where the programmable system is a Digital Signal Processor (DSP).

33. The device of claim 29 wherein the programmable system is a Programmable Logic Device (PLD).

34. The device of claim 29 where the programmable system is a microcontroller.

* * * * *